(12) United States Patent
Thompson

(10) Patent No.: US 10,638,629 B2
(45) Date of Patent: Apr. 28, 2020

(54) ON BOARD TRANSCEIVER ASSEMBLY HAVING HOLD DOWN MEMBER

(71) Applicant: FCI USA LLC, Etters, PA (US)

(72) Inventor: John P. Thompson, Etters, PA (US)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 15/526,469

(22) PCT Filed: Nov. 12, 2015

(86) PCT No.: PCT/US2015/060281
§ 371 (c)(1),
(2) Date: May 12, 2017

(87) PCT Pub. No.: WO2016/077524
PCT Pub. Date: May 19, 2016

(65) Prior Publication Data
US 2017/0325349 A1 Nov. 9, 2017

Related U.S. Application Data

(60) Provisional application No. 62/079,786, filed on Nov. 14, 2014.

(51) Int. Cl.
*H05K 7/10* (2006.01)
*H05K 7/12* (2006.01)
(Continued)

(52) U.S. Cl.
CPC .......... *H05K 7/1061* (2013.01); *H05K 1/114* (2013.01); *H05K 1/14* (2013.01); *H05K 1/181* (2013.01); *H05K 3/429* (2013.01); *H05K 7/12* (2013.01)

(58) Field of Classification Search
None
See application file for complete search history.

(56) References Cited

U.S. PATENT DOCUMENTS

| 5,221,209 A * | 6/1993 | D'Amico | G01R 1/0483 |
| | | | 439/66 |
| 5,738,531 A * | 4/1998 | Beaman | G01R 1/0483 |
| | | | 257/E23.067 |

(Continued)

FOREIGN PATENT DOCUMENTS

| CN | 1384590 A | 12/2002 |
| CN | 1618127 A | 5/2005 |

(Continued)

OTHER PUBLICATIONS

International Search Report and Written Opinion for International Application No. PCT/US2015/060281 dated Apr. 8, 2016.
(Continued)

*Primary Examiner* — Xanthia C Cunningham
(74) *Attorney, Agent, or Firm* — Wolf, Greenfield & Sacks, P.C.

(57) ABSTRACT

A hold down member can be surface mounted to a substrate, such that a post of the hold down member extends at least into an interposer. Accordingly, when an on board transceiver is placed in electrical communication with the interposer, a fastener can be inserted at least into the on board transceiver so as to attach to the post, thereby securing the on board transceiver to the interposer and the substrate.

19 Claims, 6 Drawing Sheets

(51) Int. Cl.
*H05K 1/11* (2006.01)
*H05K 1/14* (2006.01)
*H05K 1/18* (2006.01)
*H05K 3/42* (2006.01)

(56) References Cited

U.S. PATENT DOCUMENTS

| | | | |
|---|---|---|---|
| 6,114,757 A | 9/2000 | Delprete | |
| 6,477,058 B1* | 11/2002 | Luebs | H05K 1/141 174/250 |
| 6,881,611 B1* | 4/2005 | Fukasawa | B29C 43/18 257/E21.502 |
| 7,008,239 B1* | 3/2006 | Ju | H01R 12/714 439/66 |
| 8,680,670 B2* | 3/2014 | Casey | H01L 23/4006 257/706 |
| 2003/0000080 A1* | 1/2003 | Colbert | H05K 7/1061 29/832 |
| 2003/0058624 A1* | 3/2003 | Deeney | H05K 3/325 361/736 |
| 2003/0146017 A1* | 8/2003 | Fan | H01L 23/49827 174/138 G |
| 2003/0201462 A1* | 10/2003 | Pommer | G02B 6/4201 257/200 |
| 2004/0047637 A1 | 3/2004 | Wang et al. | |
| 2005/0276547 A1 | 12/2005 | Wang et al. | |
| 2010/0323538 A1* | 12/2010 | McClellan | H01R 13/629 439/65 |
| 2011/0207344 A1 | 8/2011 | McColloch | |
| 2016/0351526 A1* | 12/2016 | Boyd | H05K 7/20 |

FOREIGN PATENT DOCUMENTS

| | | | |
|---|---|---|---|
| CN | 2742628 Y | 11/2005 | |
| CN | 2747739 Y | 12/2005 | |
| CN | 1942053 A | 4/2007 | |
| CN | 203491477 U | 3/2014 | |
| WO | WO 2014-068358 A1 | 5/2014 | |
| WO | WO 2014068358 A1 * | 5/2014 | G02B 6/4284 |
| WO | WO 2016077524 A1 * | 5/2016 | H05K 7/1061 |

OTHER PUBLICATIONS

International Preliminary Report on Patentability for International Application No. PCT/US2015/060281 dated May 26, 2017.
CN 201580061758.9, Feb. 25, 2019, Chinese Office Action.
Chinese Office Action for Application No. CN 201580061758.9 dated Feb. 25, 2019.

* cited by examiner

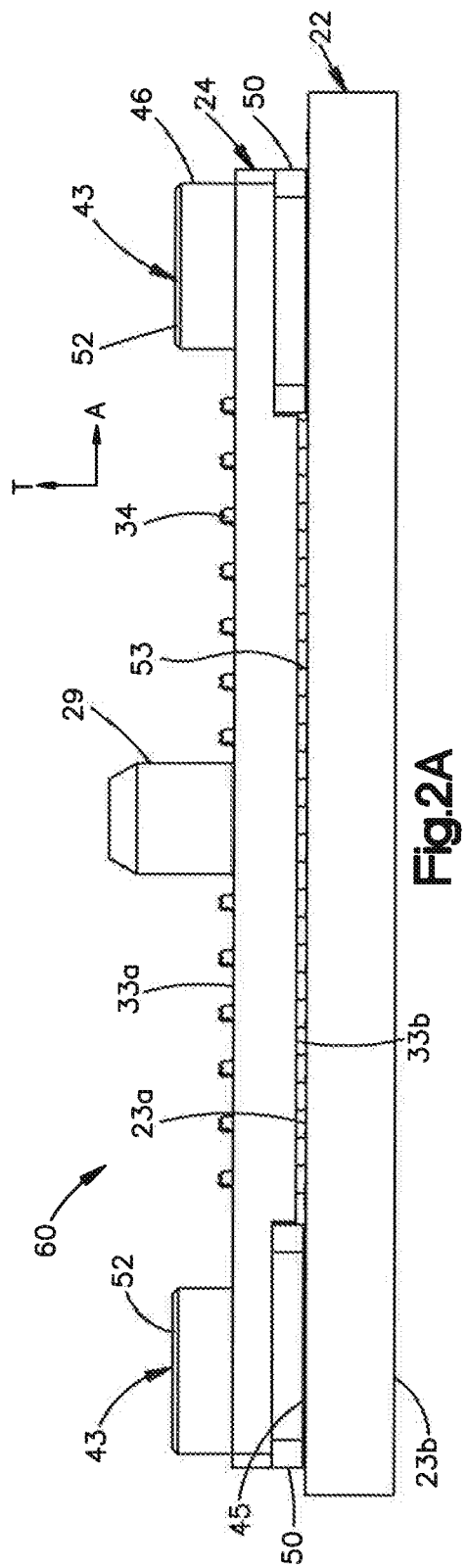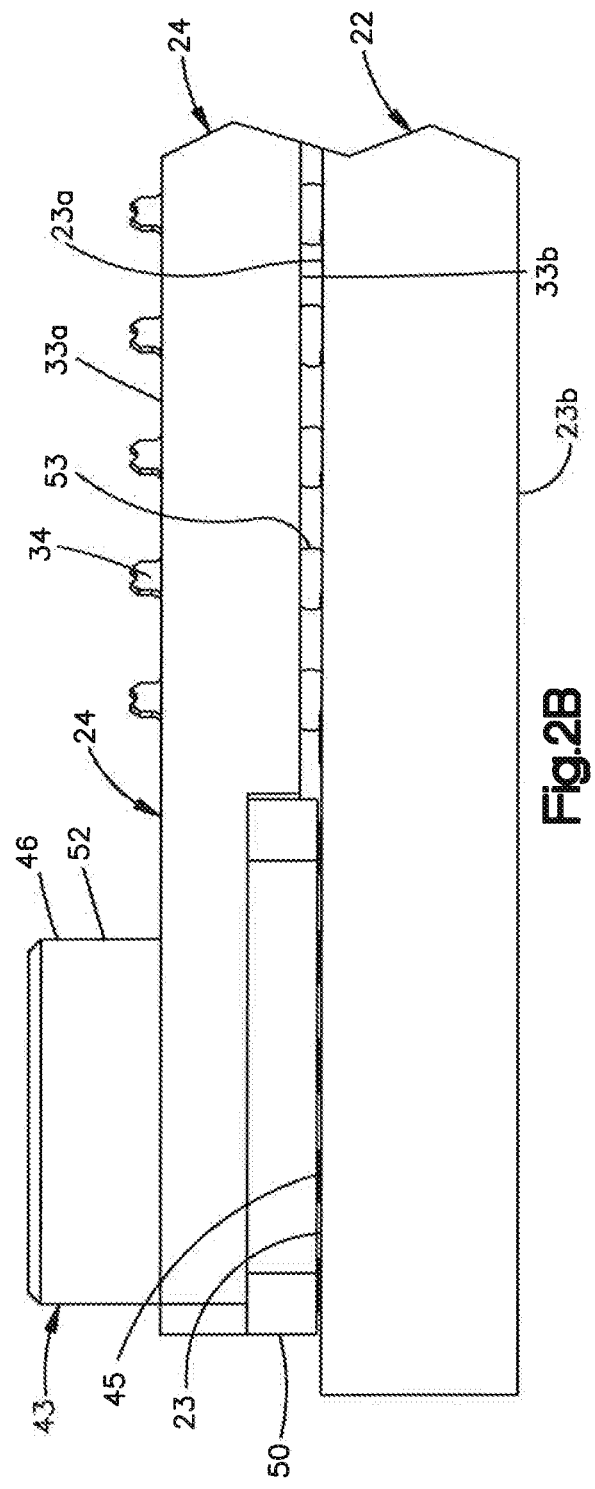
Fig.2A
Fig.2B

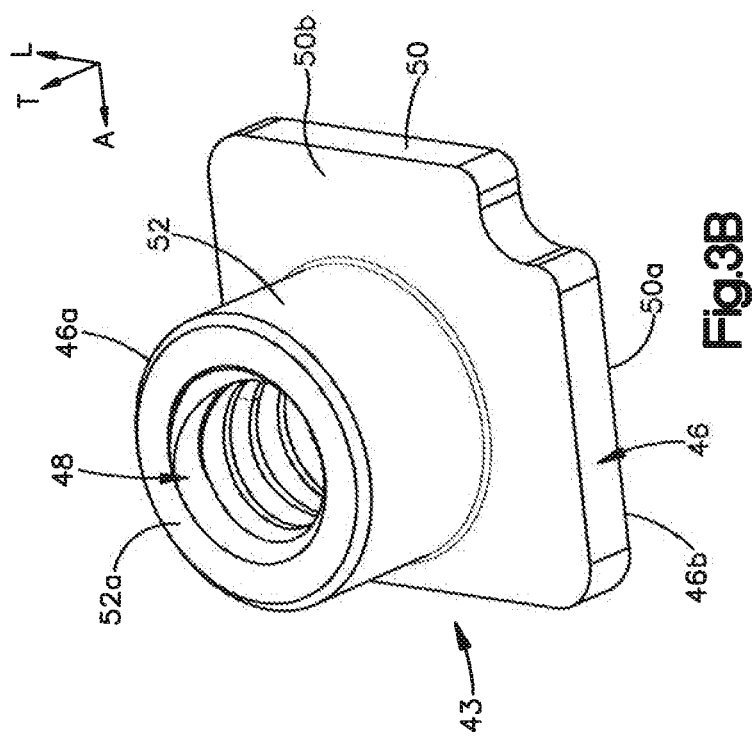
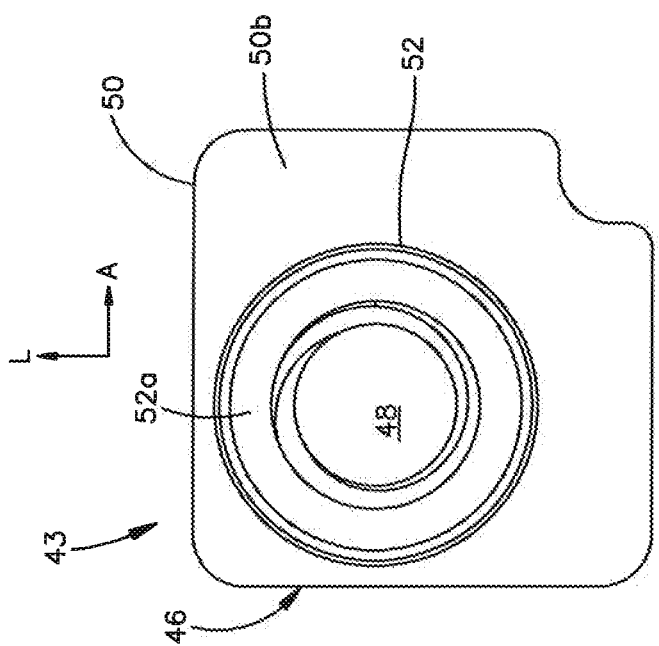

ON BOARD TRANSCEIVER ASSEMBLY HAVING HOLD DOWN MEMBER

RELATED APPLICATIONS

This application is the U.S. National Stage of and claims priority to and the benefit of International Patent Application Number PCT/US2015/060281, entitled "ON BOARD TRANSCEIVER ASSEMBLY HAVING HOLD DOWN MEMBER," filed Nov. 12, 2015, which claims priority to and the benefit of U.S. Provisional Patent Application No. 62/079,786, filed Nov. 14, 2014. The entire contents of the foregoing are hereby incorporated herein by reference.

BACKGROUND

Transceiver assemblies typically include a substrate, such as a printed circuit board, and an on-board transceiver that is mounted onto a substrate. The transceiver thus is configured to receive and transmit optical signals between the substrate and an electrical or optoelectrical component that is in communication with the transceiver. Transceivers can be conventionally mounted directly to the substrate. Alternatively, the transceiver assemblies can include an interposer that is mounted to the substrate, such that the transceiver is mounted to the interposer. One design consideration in transceivers is the ability to reliably attach the transceiver to the substrate.

SUMMARY

In one embodiment, an electrical assembly can include a substrate that carries electrically conductive cases, and defines an array of contact locations in electrical communication with respective ones of the electrically conductive traces. The electrical assembly can further include a hold down member that is configured to be mounted to a surface of the substrate. The electrical assembly can further include an interposer that is configured to be mounted to the substrate, and mated to an on board transceiver. The interposer has electrical contacts that define mounting ends configured to mount to respective ones of the contact locations when the interposer is mounted to the substrate, and mating ends configured to mate with complementary electrical contacts of the on board transceiver when the interposer is mated to the on board transceiver. The hold down member is configured to attach to a fastener so as to secure the on board transceiver to the substrate.

BRIEF DESCRIPTION OF THE DRAWINGS

The foregoing summary, as well as the following detailed description of preferred embodiments of the application, will be better understood when read in conjunction with the appended drawings. For the purposes of illustrating the embodiments of the present disclosure, there is shown in the drawings preferred embodiments. It should be understood, however, that the disclosure is not limited to the precise arrangements and instrumentalities shown. In the drawings:

FIG. 2A is a side elevation view of an electrical assembly of the on board transceiver assembly illustrated in FIG. 1, the electrical assembly including the substrate, the interposer, the fasteners, and a plurality of hold down members mounted to the substrate;

FIG. 2B is an enlarged side elevation view of a portion of the electrical assembly illustrated in FIG. 2A;

FIG. 3A is a top plan view of one of the hold down members illustrated in FIG. 1, the illustrated hold down member being representative of all hold down members;

FIG. 3B is a perspective view the hold down member illustrated in FIG. 3A;

DETAILED DESCRIPTION

Figure 1:
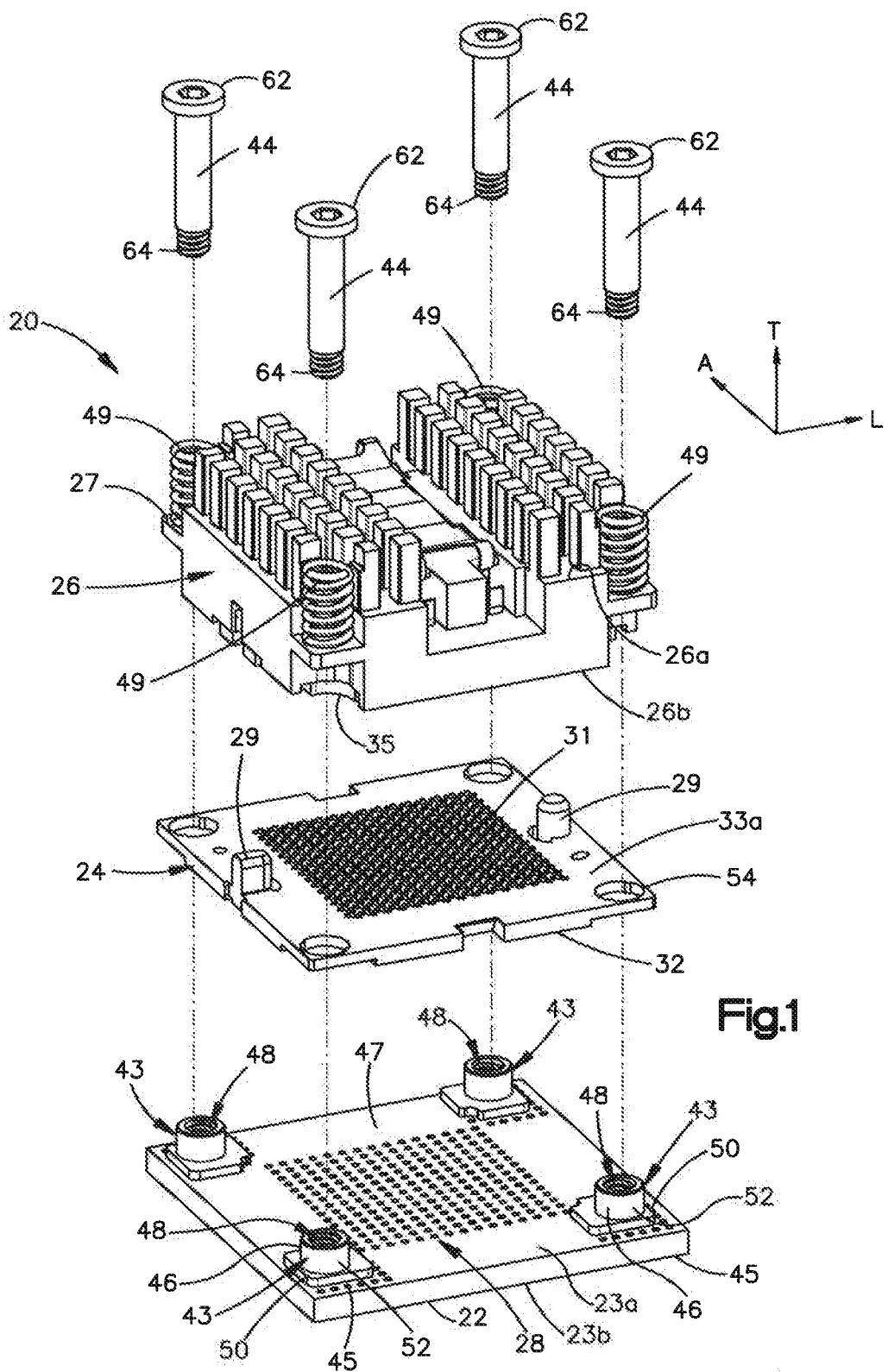
FIG. 1 is an exploded perspective view of an on board transceiver assembly including a substrate, a plurality of hold down members mounted to the substrate, an interposer, an on board transceiver, and a plurality of fasteners.
Figure 4C:
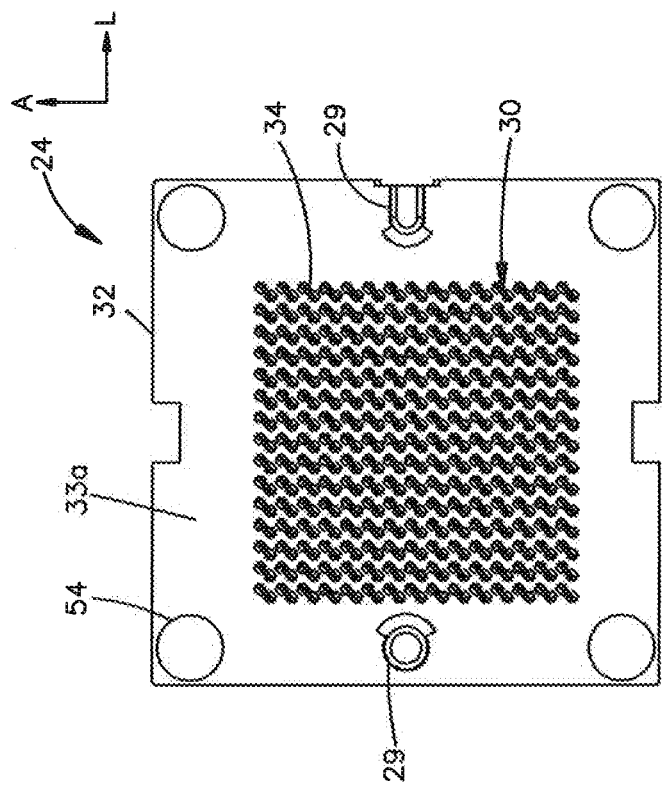
FIG. 4C is a side elevation view of another side of the interposer illustrated in FIG. 4A.
Figure 4A:
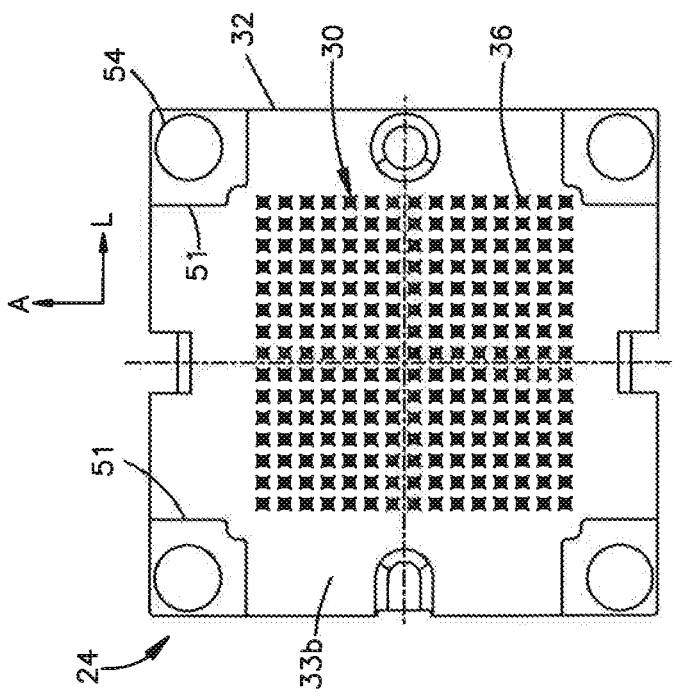
FIG. 4A is a top plan view of one side of the interposer illustrated in FIG. 1, including an interposer housing and a plurality of electrical contacts supported by the interposer housing.
Figure 4B:
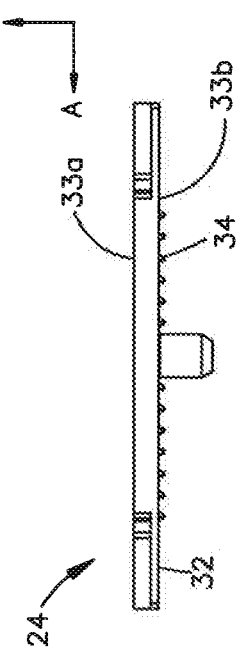
FIG. 4B is a side elevation view of the interposer illustrated in FIG. 4A.
Figure 4D:
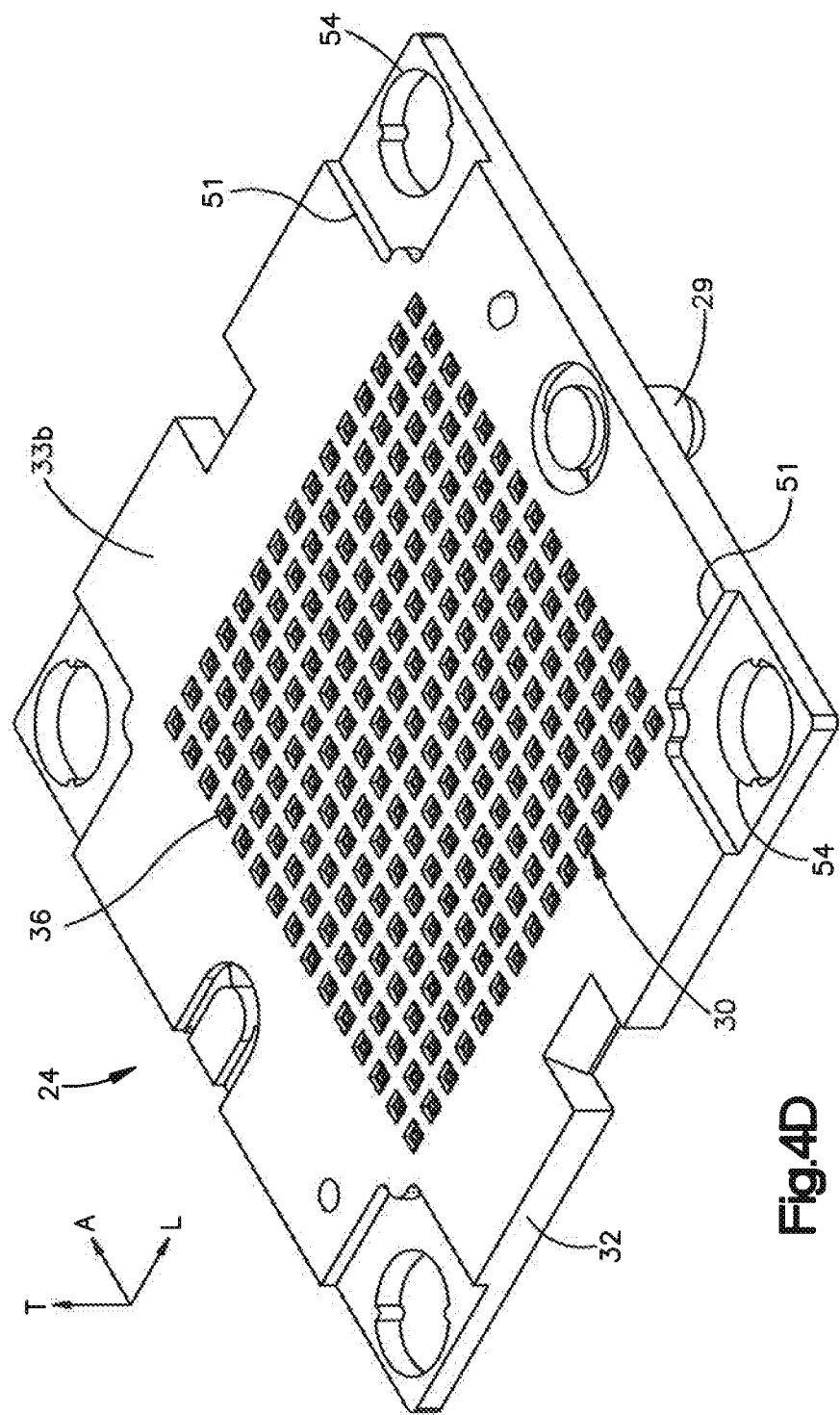
FIG. 4D is a perspective view of the interposer illustrated in FIG. 4A.

Referring initially to FIGS. 1-2B, an on board transceiver assembly 20 can include a substrate 22, an interposer 24 configured to be mounted to the substrate 22, and an on board transceiver 26 configured to be placed in electrical communication with the interposer 24, thereby placing the on board transceiver 26 in electrical communication with the substrate 22. Accordingly, the interposer 24 is disposed between the substrate 22 and the transceiver 26. The substrate 22 can carry a plurality of electrically conductive traces, and can further define an array 28 of contact locations that are in electrical communication with respective ones of the electrically conductive traces. In this regard, the substrate 22 can be configured as a printed circuit board. The substrate 22 defines a first or upper surface 23a and a second or lower surface 23b opposite the first surface 23a along a transverse direction T. The transverse direction T can be referred to as a first direction. The first surface 23a can carry electrical contact locations that can be configured as electrical contact pads 47. The first and second surfaces 23a and 23b can extend along respective planes that are defined by a longitudinal direction L that is perpendicular to the transverse direction T and a lateral direction A that is perpendicular to each of the transverse direction T and the longitudinal direction L. The interposer 24 is configured to be mounted to the substrate 22 along the transverse direction T, and the interposer 24 is configured to mate with the interposer 24 along the transverse direction T.

Referring also to FIGS. 4A-5C, the interposer 24 includes an interposer housing 32 having a first or upper surface 33a and a or lower second surface 33b opposite the first surface 33a along the transverse direction T. The interposer housing 32 can be dielectric or electrically insulative. The interposer 24 further includes a plurality of electrical contacts 31 supported by the interposer housing 32. The electrical contacts 31 can be arranged in an array including a plurality of rows and columns that are perpendicular to the rows. The electrical contacts 31 define mating ends 34 and mounting ends 36 opposite the mating ends 34. For instance, the mating ends 34 and the mounting ends 36 can be spaced from each other along the transverse direction T. The mating ends 34 are disposed proximate to the first surface 33a and are configured to mate with complementary electrical contacts of the on board transceiver 26 when the on board transceiver 26 is mated to the interposer 24. For instance, the mating ends 34 can define a land grid array (LGA). The mounting ends 36 are disposed proximate to the second surface 33b and are configured to be mounted to respective ones of the contact locations of the substrate 22 when the interposer is mounted to the substrate 22. In particular, the mounting ends 36 can be configured to be surface mounted to the first surface 23a of the substrate 22. The mounting ends 36 can define a ball grid array (BGA). Thus, the mounting ends 36 are configured to be mounted to respective ones of the contact locations of the substrate 22 via respective fusible elements 53 that are configured to be fused to the contact pads 47 so as to mount the mounting ends 36 to the contact locations of the substrate 22. For instance, the fusible elements 53 can be configured as solder balls that are configured to be soldered to the contact pads 47.

The interposer 24 can further include at least one aperture 54 such as a plurality of apertures 54 that extend through the interposer housing 32 along the transverse direction T. The apertures 54 can be disposed at respective locations so as to be positioned outside the array 30 of electrical contacts 31 with respect to the lateral and longitudinal directions A and L, respectively. In particular, straight lines that extend between adjacent ones of the respective central axes of the apertures 54 can define a perimeter that surrounds the array 30 of all of the electrical contacts 31, such that no electrical contacts 31 are disposed outside the perimeter defined by the straight lines.

The interposer 24 can further include at least one alignment post 29, such as a pair of alignment posts 29, that extend out from the interposer housing 32 and are received by respective guide openings of the on board transceiver 26 so as to align the electrical contacts of the on board transceiver 26 with the mating ends 34 of the interposer 24. The alignment posts 29 can define different cross-sections with respect to each other, such that the alignment posts 29 can only be received in the respective guide openings when the interposer 24 is in a select orientation with respect to the transceiver 26. The alignment posts 29 interfere with the transceiver and prevent the interposer from mating with the transceiver when the interposer is not in the select orientation with respect to the transceiver.

Referring to FIGS. 1-2B, the on board transceiver assembly 20 can further include a hold down assembly that, in turn, includes and at least one hold down member 43 such as a plurality of hold down members 43, and at least one fastener 44 such as a plurality of fasteners 44. The hold down members 43 are configured to be mounted to the substrate 22. In particular, the hold down members 43 are configured to be attached to the first surface 23a of the substrate 22 such that the hold down members 43 extend out from the surface 23a. The fasteners 44 are configured to attach to respective ones of the hold down members 43 so as to secure the on board transceiver 26 to the substrate 22. The hold down assembly can further include a biasing member such as a spring 49 that provides a compressive farce to the transceiver 26 and the interposer 24 toward the substrate 22.

The transceiver 26 includes a first or upper end 26a, and a second or lower end 26b that is opposite the first end 26a along the transverse direction T. The transceiver 26 can further include a plurality of apertures 27 that extend therethrough from the first end 26a to the second end 26b. For instance, the apertures 27 can extend from the first end 26a to the second end 26b along the transverse direction T. The biasing member is configured to seat against the first end 26a. The biasing member can be configured as a spring 49, such as a coil spring that is seated against the first end 26a. The coil springs can each define an internal opening that is aligned with the central axis of a respective one of the apertures 27. The transceiver 26 can further include a plurality of recesses 35 that extend into the second end 26b. The recesses 35 can be positioned such that the apertures 27 are aligned against a respective one of the recesses 35 along the transverse direction T. The recesses 35 can define a cross-sectional dimension along a respective plane that is oriented normal to the transverse direction T that is sized greater than a cross-sectional dimension of the apertures 27 along a respective plane that is oriented normal to the transverse direction T The fasteners 44 define a head 62 and a shaft 64 that extends from the head 62. The head 62 can extend radially out from the shaft 64. The fasteners 44 can be oriented along the transverse direction T such that the shaft 64 extends from the head 62 along the transverse direction T. The fasteners 44, and in particular the shafts 64, are configured to extend through the apertures 27 of the on board transceiver 26 and the interposer 24, and attach to the hold down members 43. For instance, the shafts 64 can be sized to extend through the internal opening of the coil springs and through the apertures 27 such that the head 62 bears against the biasing member. In one example, the head 62 can bear directly against the biasing member. Alternatively, the head 62 can bear indirectly against the biasing member. For instance, the head 44 can bear against an intermediate structure, such as a washer that receives the shaft, such that the washer bears directly against the biasing member.

It should be appreciated that the hold down assembly is configured to capture the on board transceiver 26 and the interposer 24 between the hold down members 43 and the fasteners 44. The biasing members can provide a retention force that resists backward migration of the fasteners 44, and further biases the transceiver 26 against the interposer 24, and biases the interposer 24 against the substrate 22. In particular, the fasteners 44 can attach to respective ones of the hold down members 43 so as to secure the on board transceiver 26 to the substrate 22. In one example, the hold down members 43 and the shafts 64 can be threaded. Thus, each of the fasteners 44, and in particular the shafts 64, can be configured to threadedly mate with a respective one of the hold down members 43. For instance, the hold down members 43 can be internally threaded and the shafts 64 can be externally threaded. Alternatively, the hold down members 43 can be externally threaded, and the shafts 44 can be internally threaded. It should be appreciated, of course, that the fasteners 44 can attach to the hold down members 43 in any suitable alternative embodiment. For instance, the fasteners 44 can define an interference fit or a press fit with the hold down members 43.

Referring now to FIGS. 1-3B, in one example, the hold down member 43 includes a hold down body 46 having a first or upper end and a second or lower end opposite the first end 46a along the transverse direction T. The hold down member 43 further includes an aperture 48 that extends into the hold down body 46, and in particular extends into the first end 46a of the hold down body 46 toward the second end 46b. For instance, the aperture 48 can extend into the hold down body 46 along the transverse direction T. The second end 46b of the hold down body 46 can be mounted to the substrate 22. For instance, the hold down member 43 can be mounted to the substrate 22, and in particular can be mounted to the first surface 23a. For example, the hold down body 46 can be surface mounted to the first surface 23a of the substrate 22. Accordingly, the hold down member 43 can be configured such that the aperture 48 terminates at a location between the first end 46a and the second end 46b with respect to the transverse direction T. Accordingly, in one example, the aperture 48 does not extend through the second end 46b, though it should be appreciated that the aperture 48 can extend into the second end 46b. Thus, it can be appreciated that the aperture 48 can extend into the hold down body 46 from the first end 46a toward the second end 46b along a direction normal to the first surface 23a of the substrate 22. The aperture 48 can terminate in the hold down body 46, or can extend completely through the hold down body 46, and in particular through the second end 46b. Further, it should be appreciated that the aperture 48 can terminate without extending into the substrate 22. Otherwise stated, the first surface 23a of the substrate 22 can be continuous and substantially (within manufacturing tolerances) planar at all locations where the first surface 23a is aligned with the aperture 48 along the transverse direction T.

The hold down body 46 can define an inner surface 40 that extends from the first surface 46a toward the second surface 46b and defines the aperture 48. The inner surfaces 40 of the hold down members 45 are configured to mate with respective ones of the fasteners 44 so as to secure the fasteners 44 to the substrate 22 when the hold down members 43 are mounted to the substrate 22. In one example, at least a portion of the inner surfaces 40 can be threaded. Similarly, at least a portion of the shafts 64 of the fasteners 44 can be threaded so as to threadedly mate with the inner surfaces 40 as the shafts 64 are rotated in the apertures 48.

With continuing reference to FIGS. 1-3B, the hold down body 46, and thus the hold down member 43, can include a base 50 that is configured to be mounted to the substrate 22. For instance, the base 50 can be surface mounted to the first surface 23a of the substrate 22. In one example, the base 50 can be soldered, welded, or otherwise mounted to the first surface 23a of the substrate 22 as desired. The base 50 can have a first or lower surface that is configured to be surface mounted to the substrate 22. Thus, the second end 46b of the hold down member 43 can be defined by the base 50. In particular, the second end 46b of the hold down member 43 can be defined by a lower surface 50a of the base 50 that faces the surface 23a of the substrate when the hold down member 43 is mounted to the substrate 22. For instance, the lower surface 50a can define a substantially flat mounting surface that is configured to mount to the first surface 23a of the substrate 22. Otherwise stated, the substantially flat mounting surface can be devoid of any types of protrusions or dimples such that fusible elements that mount the hold down member 43 to the first surface 23a of the substrate adhere directly to the substantially flat mounting surface. The fusible elements can be configured as solder balls. Further, the substantially flat mounting surface defined by the lower surface 50a of the base can lie on a common plane with an entirety of a remainder of the lower surface 50a. The common plane cart be oriented normal to the transverse direction T. In one example, the substantially flat mounting surface is located at a corner of the lower surface 50a. The corner can be defined as an intersection of two intersecting portions of an outer perimeter of the lower surface 50a. The two intersecting portions can be defined by straight lines or alternatively shaped lines as desired. The base 50 further defines a second or upper surface opposite the first or lower surface 50a.

The hold down member 43 can further include a post 52 that extends from the base 50 in a direction away from the substrate 22. Thus, the first end 46a can be defined by the post 52. In particular, the post 52 can extend from the base 50 to a terminal end of the post 52. Accordingly, the first end 46a can be defined by the terminal end 52a of the post 52. Further, the first end 46a can be referred to as a free end. For instance, the post 52 can extend from the base 50 in a direction away from the substrate 22 that is normal to the first surface 23a when the hold down member 43 is mounted to the substrate 22. In one example, the post 52 extends out from the upper surface 50b of the base 50. The aperture 48 can extend through at least a portion of the post 52 from the terminal end 52a toward the base 50. For instance, the aperture 48 can extend through an entirety of the post 52 from the terminal end 52a to the base 50. The aperture 48 can terminate at a location between the terminal end 52a and the base 50. Alternatively, the aperture 48 can extend into the base 50 and terminate in the base. Alternatively still, the aperture 48 can extend through the base 50.

The post 52 can be internally threaded so as to threadedly mate with the fastener 44. In particular, the inner surface 40 can be defined by at least a portion of the post 52 up to an entirety of the post 52. The inner surface can terminate without entering the base, or can extend into or through the base 50 as desired.

Each of the plurality of the hold down members 43 can be mounted to the substrate 22 at respective locations 45 so as to be positioned outside the array 28 of contact locations of the substrate 22 with respect to the lateral and longitudinal directions A and L, respectively. In particular, straight lines that extend between adjacent ones of the locations 45 can define a perimeter that surrounds the array 28 of all contact locations to which respective electrical contacts 31 of the interposer 24 are mounted. Thus, in one example, no electrical contacts 31 of the interposer 24 are mounted to the substrate at a location outside the perimeter defined by the straight lines. Further, it can be said that the hold down members 43 can define a perimeter that surrounds the array 28 of all contact locations to which respective electrical contacts 31 of the interposer 24 are mounted.

The base 50 and the post 52 can be monolithic with each other in one example. Alternatively, the post 52 can be attached to the base 50. The hold down members 43 can be made from any suitable material. In one example, the base 50 can be configured to be fused to the substrate 22. For instance, the hold down member 43, and in particular the bases 50, can be metallic so as to be soldered or welded to the surface 23 of the substrate at the respective locations 45. In one example, the hold down member 43 can comprise a first material coated with a second material different than the first material. In one example, the first material can be a metal. The second material can also be a metal. The first metal can be nickel. The second metal can be brass that is plated onto the first metal. It should be appreciated that the base 50 can alternatively be attached to the substrate 22 in any suitable alternative embodiment as desired. In one embodiment, the hold down member 43 and the fusible elements 53 (see FIGS. 2A-2B), can be simultaneously fused to the substrate 22.

When the interposer 24 is mounted to the substrate 22, and in particular to the surface 23 of the substrate 22, the interposer 24 is disposed adjacent the substrate 22 in the direction that is normal to the surface 23. Accordingly, the post 52 can extend at least into a respective one of the apertures 54 that extend through the interposer housing 32. For instance, the aperture 54 can extend through the interposer housing 32. The aperture 54 can extend through the interposer housing 32 in the direction that is normal to the surface 23 when the interposer 24 is mounted to the substrate 22. The posts 52 can extend entirely through the respective ones of the apertures 54, and thus through the interposer 24. The apertures 54 can be sized substantially equal to the posts 52 with respect to a plane that is oriented normal to the transverse direction T, such that interference between the posts 52 and the interposer housing 32 prevents relative rotation between the interposer 24 and the substrate 22 about an axis that extends in the transverse direction T. Further, it is recognized that mechanical interference between the posts 52 and the interposer housing 32 can prevent thermal expansion of the interposer housing 32 along a plane that is normal to the transverse direction T, and thus parallel to the first surface 23a of the substrate 22, during operation of the on board transceiver assembly 20.

The posts 52 can extend along the transverse direction T through respective ones of the apertures 54 of the interposer 24 and into respective ones of the recesses 35 of the on board transceiver 26. Accordingly, the central axes of the apertures 48 of the hold down members 43 are aligned with the central axes of the respective ones of the apertures 27 of the transceiver 26 along the transverse direction T. Thus, the posts 52 of the hold down member 43 can extend from the base 50, through the interposer 24, and into the transceiver 26.

Figure 5:
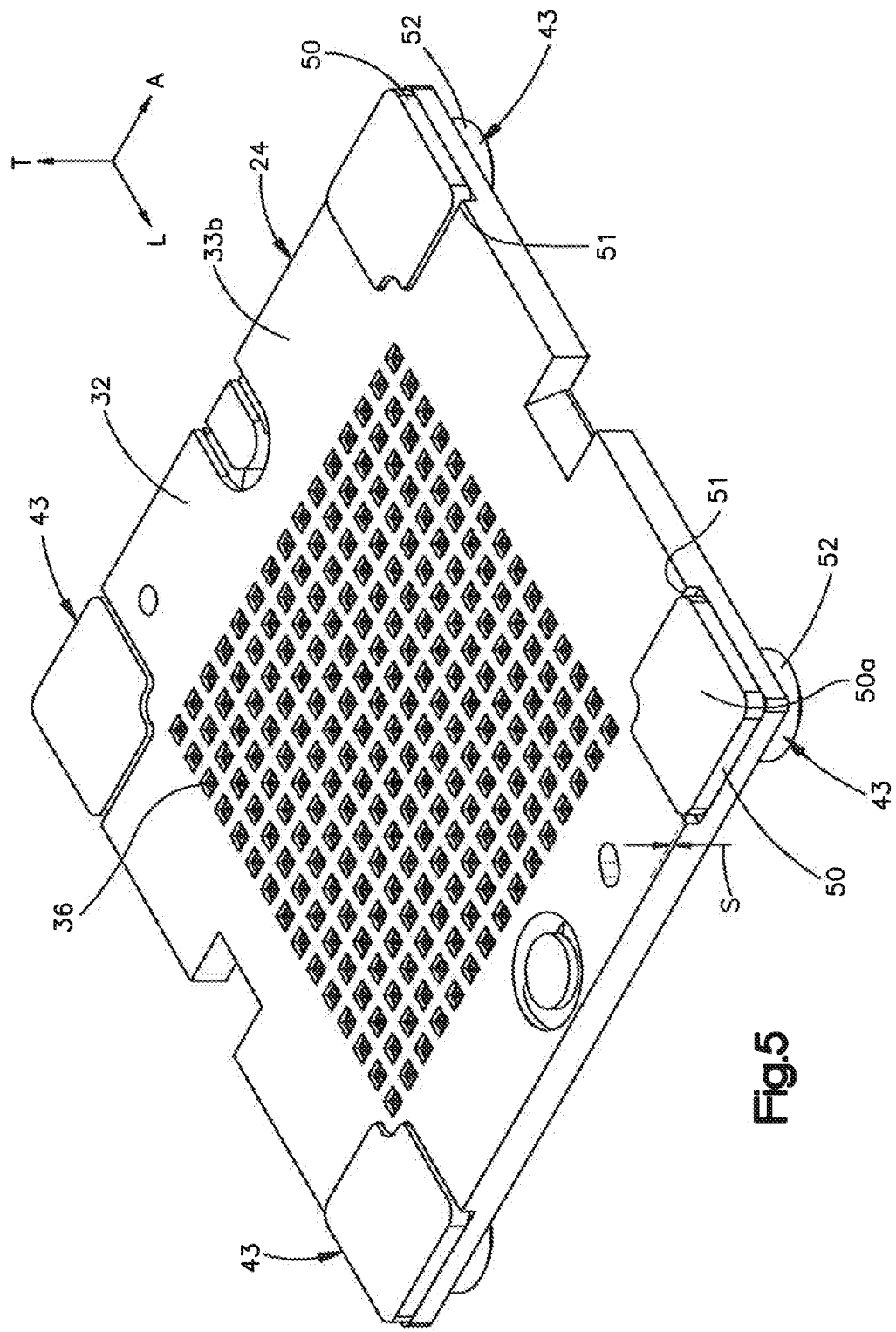
FIG. 5 is a perspective view of the interposer housing, showing the hold down members extending through respective apertures of the interposer housing.

Referring now also to FIG. 5, the base 50 can define a standoff S along the transvers direction T between the first surface 50a of the base 50 and the second surface 33b the interposer 24. Thus, the base 50 further defines the standoff S between the substrate 22 and the interposer 24, in particular, the standoff S can be defined between the first surface 23a of the substrate 22 and the second surface 33b of the interposer 24. The standoff S can have a height along a direction normal to the substrate 22 that is less than a height of the fusible elements 53 that are configured to mount the mounting ends 36 to the substrate 22. The base 50 can have any suitable height as desired. For instance, the base 50 can have a height greater than the height of the standoff, but can be positioned in a recess 51 that extends into the interposer housing 32, and in particular into the second surface 33b, such that a portion of the base 50 extends down with respect to the interposer housing 32. The portion of the hold down member 43 that extends out with respect to the second surface 33b of the interposer housing 32 can define the standoff. It should thus be appreciated that the hold down member 43 can be configured such that the entirety of the height of the base 50 along the transverse direction T can be disposed between the interposer 24 and the substrate 22, such that the entirety of the height of the base 50 can define the standoff S. The standoff S is configured to prevent overstressing of the BGA mounting ends 36 when, for instance, a portion of the interposer 24 is pushed toward the substrate 22 at a location offset from a central axis of the interposer 24 that is oriented along the transverse direction T. Further, the standoff S is configured to prevent overstressing of the BGA mounting ends 36 when, for instance, a portion of the interposer 24 is toward or away from the substrate 22.

It should be appreciated that the on board transceiver assembly 20 can include an electrical assembly 60 and the on board transceiver 26. The electrical assembly 60 can include one or more up to all of the substrate 22, the hold down members 43, the interposer 24, and the fasteners 44. In one example, the shaft 64 can be threaded. Further as described above, the shaft 64 is sized to be inserted through the on board transceiver 26 and at least into the interposer 24 so as to attach to the hold down member 43. In particular, the shaft 64 can be configured to attach to the post 52. The posts 52 can extend into the transceiver 26. For instance, the posts 52 can extend into respective ones of the recesses 35 of the transceiver 26. In one example, the shaft 64 of the fastener 44 can attach to the post 52 in the aperture 48 that extends into the post 52. Thus, the fasteners 44 can be inserted into the respective hold down members 43 without first passing through the interposer 24. Otherwise stated, the apertures 48 can be open to the apertures 27 of the transceiver 26 at a location between the interposer and the transceiver 26 along the transverse direction T. Further, it can be said that the apertures 48 are open at a location such that the interposer 24 is disposed between the location and the substrate 22 when the hold down members 43 and the interposer 24 are each mounted to the substrate 22. In one example, the shaft 64 is threaded, and is configured to threadedly mate with the post 52 inside the aperture 48 that extends into the post 52. It should be appreciated, of course, that the shaft can attach to the hold down member in accordance with any alternative embodiment as desired. For instance, the fastener 44 and the post 52 can be press fit to each other. In one example, the shaft 64 can be press fit in the aperture 48 of the post 52. Alternatively, the shaft 64 can receive the post 52 such that the post 52 is press fit in the fastener 44. Alternatively, the shaft 64 can be interference fit in the aperture 48 of the post 52. Alternatively still, the post 52 can be interference fit in an aperture of the shaft 64.

Thus, the fastener 44 is configured to be inserted at least into the on board transceiver 26 so as to attach to the post 52. It is recognized that the shaft 64 can terminate in the hold down member 43 without extending into the substrate 22. The head 62 is configured to apply a retention force against the on board transceiver 26 in a direction toward the interposer 24, and thus toward the substrate 22. For instance, the head 62 can bear directly against the on board transceiver 26. Alternatively, an intermediate structure such as the biasing member can be captured between the head 62 and the on board transceiver 26, such that the head bears indirectly against the on board transceiver 26. For example, the shafts 64 of the fasteners 44 can be inserted through the springs 49, through the apertures 27 of the transceiver 26, and into the hold down members 43. The heads 62 of the fasteners 44 can compress the respective springs 49 against the first end 26a of the transceiver 26 as the fasteners 44 are driven into the respective ones of the hold down members 43. Thus, the springs 49 create a compressive force between the heads 62 of the fasteners 44 and the transceiver 26. Because the fasteners 44 are rigidly attached to the hold down members 43, the spring force urges the transceiver 26 in a direction toward the interposer 24, and urns the interposer 24 in a direction toward the substrate 22.

Referring again to FIG. 1, the on board transceiver 26 is configured to mate with a complementary cable connector. For instance, the on board transceiver comprises 26 can include receiving contacts that are configured to receive optical signals from a corresponding array of optical fibers of the complementary cable connector. The on board transceiver 26 can further include a transceiver board that is configured to convert the optical signals to electrical signals that are communicated through the interposer 24 and to the substrate 22. Unless otherwise indicated herein, the on board transceiver 26 can be constructed as described in PCT Patent Publication No. WO 2014/068358 A1, published on May 8, 2014, the disclosure of which is hereby incorporated by reference as if set forth in its entirety herein.

It should be noted that the illustrations and discussions of the embodiments shown in the figures are for exemplary purposes only, and should not be construed limiting the disclosure. One skilled in the art will appreciate that the present disclosure contemplates various embodiments. It should be further appreciated that the features and structures described and illustrated in accordance one embodiment can apply to all embodiments as described herein, unless otherwise indicated. Additionally, it should be understood that the concepts described above with the above-described embodiments may be employed alone or in combination with any of the other embodiments described above.

What is claimed:

1. An electrical assembly comprising:
a substrate comprising an array of contact locations disposed on a surface of the substrate;
a hold down member having a substantially flat mounting surface that is configured to be mounted directly to the surface of the substrate, such that the hold down member extends out from the surface of the substrate;
an interposer mounted to the surface of the substrate and configured to be mated to an electronic component, wherein the interposer comprises electrical contacts comprising mounting ends and mating ends, the mounting ends being mounted to respective ones of the contact locations, the mating ends being configured to mate with complementary electrical contacts of the electronic component when the interposer is mated to the electronic component; and
wherein:
the interposer comprises a face, facing the surface of the substrate, and the face comprises apertures receiving mounting ends of the electrical contacts of the interposer and solder balls;
the hold down member is configured to attach to a fastener that couples the electronic component to the interposer; and
the hold down member is exposed in the face of the interposer such that the substantially flat mounting surface of the hold down member is positioned for surface mount soldering to the surface of the substrate when the solder balls are fused to the contact locations on the surface of the substrate.

2. The electrical assembly as recited in claim 1, wherein the hold down member is threaded and configured to threadedly mate with the fastener.

3. The electrical assembly as recited in claim 1, wherein the hold down member comprises a hold down body and an aperture that extends into the hold down body, wherein at least a portion of an inner surface of the hold down body that defines the aperture is threaded.

4. The electrical assembly as recited in claim 3, wherein the surface of the substrate is substantially planar at all locations where the surface of the substrate is aligned with the aperture along a direction normal to the surface of the substrate.

5. The electrical assembly as recited in claim 1, wherein the mating ends comprise at least a portion of a land grid array.

6. The electrical assembly as recited in claim 1, wherein the fastener comprises a head and a threaded shaft, the threaded shaft being sized to be inserted through the on board transceiver and threadedly purchase with the hold down member, the head being configured to apply a retention force against the on board transceiver in a direction toward the interposer.

7. The electrical assembly as recited in claim 1, further comprising a plurality of hold down members positioned outside of the array of contact locations.

8. The electrical assembly as recited in claim 7, further comprising a plurality of fasteners configured to attach to respective hold down members of the plurality of hold down members.

9. The electrical assembly as recited in claim 1, further comprising a biasing member configured to be captured between the electronic component and the fastener, wherein the biasing member applies a force to at least one of the electronic component and the interposer in a direction toward the substrate.

10. The electrical assembly as recited in claim 1, wherein the on board transceiver is configured to mate with a complementary cable connector.

11. The electrical assembly as recited in claim 10, wherein the on board transceiver is configured to convert the optical signals to electrical signals that are communicated to the substrate through the interposer.

12. The electrical assembly as recited in claim 1, wherein the mounting ends comprise at least a portion of a ball grid array.

13. An electrical assembly comprising:
a substrate comprising an array of contact locations disposed on a surface of the substrate;
a hold down member having a substantially flat mounting surface that is mounted to the surface of the substrate, such that the hold down member extends out from the surface of the substrate, wherein the hold down member comprises a base mounted to the substrate and a post that extends from the base;
an interposer mounted to the surface of the substrate and configured to be mated to an electronic component, wherein the interposer comprises electrical contacts comprising mounting ends and mating ends, the mounting ends being mounted to respective ones of the contact locations when the interposer is mounted to the substrate, the mating ends being configured to mate with complementary electrical contacts of the electronic component when the interposer is mated to the electronic component; and
wherein:
the interposer is soldered to the substrate at the contact locations;
the substantially flat mounting surface of the hold down member is soldered to the surface of the substrate; and
the post of the hold down member is configured to attach to a fastener that couples the electronic component to the interposer.

14. The electrical assembly as recited in claim 13, wherein the post extends at least into the interposer and is configured to attach to a fastener that couples the electronic component to the interposer.

15. The electrical assembly as recited in claim 14, wherein the post extends entirely through the interposer.

16. The electrical assembly as recited in claim 13, comprising a plurality of posts configured to mechanically interfere with thermal expansion of the interposer.

17. The electrical assembly as recited in claim 13, wherein the base comprises a standoff disposed between the substrate and the interposer, the standoff having a first height along a direction normal to the substrate that is less than a second height along the direction normal to the substrate of fusible elements that mount the mounting ends to the substrate.

18. An interposer with a hold down member, the interposer comprising:

a housing comprising a mounting face and a mating face, the mounting face and mating face opposing each other, the housing comprising one or more recesses in the mounting face;

an array of electrical contacts having mounting ends disposed on the mounting face and mating ends disposed on the mating face, the mounting ends being configured to mount to a substrate and the mating ends being configured to mate with an electronic component;

one or more hold down members, the one or more hold down members comprising a base having a lower surface, wherein:
  the lower surface is a substantially flat mounting surface that is configured to be surface mounted to a substrate;
  the base of the one or more hold down members is disposed in respective recesses of the one or more recesses;

the lower surface of the base of the one or more hold down members extends beyond the mounting face so as to provide a standoff having a first height along a direction normal to the mounting face.

19. The electrical assembly as recited in claim 18, wherein:
  the mounting ends are configured to be surface mounted to the surface of the substrate when the interposer is mounted to the substrate; and
  the first height is less than a second height along the direction normal to the mounting surface of fusible elements configured to be mounted in electrical communication with the substrate.

* * * * *